(12) United States Patent
Tasaki et al.

(10) Patent No.: US 12,194,697 B2
(45) Date of Patent: Jan. 14, 2025

(54) METHOD FOR MODIFYING OPTICAL PROPERTIES OF SYNTHETIC RESIN

(71) Applicant: ASAHI RUBBER INC., Saitama (JP)

(72) Inventors: Masutugu Tasaki, Saitama (JP); Yuta Ito, Saitama (JP); Takeru Kawaguchi, Saitama (JP); Nobuyuki Tomizawa, Saitama (JP)

(73) Assignee: ASAHI RUBBER INC., Saitama (JP)

( * ) Notice: Subject to any disclaimer, the term of this patent is extended or adjusted under 35 U.S.C. 154(b) by 0 days.

(21) Appl. No.: 18/011,665

(22) PCT Filed: Sep. 17, 2021

(86) PCT No.: PCT/JP2021/034383
§ 371 (c)(1),
(2) Date: Dec. 20, 2022

(87) PCT Pub. No.: WO2022/075049
PCT Pub. Date: Apr. 14, 2022

(65) Prior Publication Data
US 2023/0249423 A1    Aug. 10, 2023

(30) Foreign Application Priority Data
Oct. 5, 2020    (JP) .................................. 2020-168699

(51) Int. Cl.
*B29D 11/00* (2006.01)
*C08J 7/12* (2006.01)
(Continued)

(52) U.S. Cl.
CPC ......... *B29D 11/00432* (2013.01); *C08J 7/123* (2013.01); *G02B 1/041* (2013.01); *B29K 2083/00* (2013.01); *C08J 2383/04* (2013.01)

(58) Field of Classification Search
CPC .... B29D 11/00432; G02B 1/041; C08J 7/123; C08J 2383/04; B29K 2083/00
See application file for complete search history.

(56) References Cited

U.S. PATENT DOCUMENTS

2007/0267645 A1    11/2007    Nakata et al.
2008/0151182 A1    6/2008    Hsu
(Continued)

FOREIGN PATENT DOCUMENTS

CN    110915006 A    3/2020
JP    2007-153970 A    6/2007
(Continued)

OTHER PUBLICATIONS

U.S. Appl. No. 18/011,681, filed Dec. 20, 2022 in the name of Masutugu Tasaki et al.
(Continued)

*Primary Examiner* — Mathieu D Vargot
(74) *Attorney, Agent, or Firm* — Oliff PLC

(57) ABSTRACT

A method for modifying optical properties of a synthetic resin increases a transmittance by modifying, removing, or reducing factors which absorb wavelengths in an ultraviolet range, such that it is possible to maintain stable and excellent reliability even after a long-term use. In a method for modifying optical properties of a synthetic resin, a modification treatment which is an energy irradiation treatment is performed on a cured product made of a synthetic resin to increase a transmittance in an ultraviolet range. For example, the modification treatment which is at least one of a photo-oxidation treatment and a thermal oxidation treatment is performed on the cured product made of the synthetic resin to increase the transmittance.

10 Claims, 14 Drawing Sheets

(51) Int. Cl.
  *G02B 1/04*    (2006.01)
  *B29K 83/00*   (2006.01)

(56)         References Cited

U.S. PATENT DOCUMENTS

2010/0304133 A1    12/2010   Maeda
2016/0280860 A1     9/2016   Ogawa
2021/0305471 A1     9/2021   Shi et al.

FOREIGN PATENT DOCUMENTS

JP    2009-276511  A      11/2009
JP    2016-183235  A      10/2016
JP    2016-186063  A      10/2016
JP    2019-207956  A      12/2019
JP    2020-009858     *    1/2020
JP    2020-009858  A       1/2020
JP    2020-104462  A       7/2020
JP    2021-520632  A       8/2021
WO    2009/110152  A1      9/2009
WO    2020/102948  A1      5/2020

OTHER PUBLICATIONS

Nov. 16, 2021 International Search Report in PCT/JP2021/034383.
Aug. 9, 2022 Office Action issued in Japanese Application No. 2022-543614.
Nov. 22, 2021 International Search Report issued iin PCT/JP2021/034382.
Oct. 21, 2024 Office Action Issued in U.S. Appl. No. 18/011,681.

* cited by examiner

*Fig. 2*
(a)
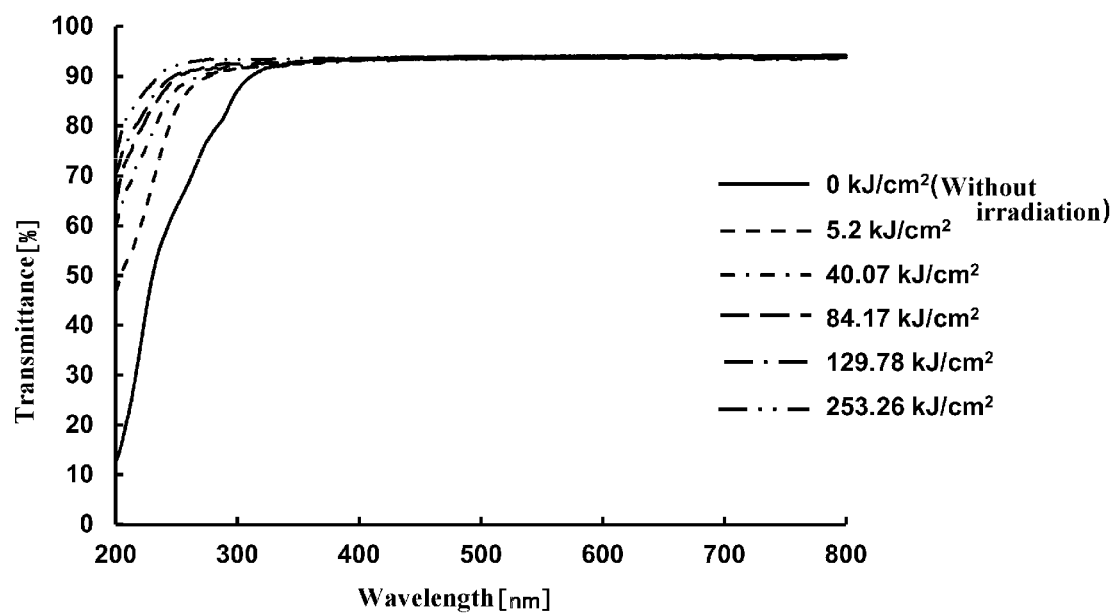
(b)
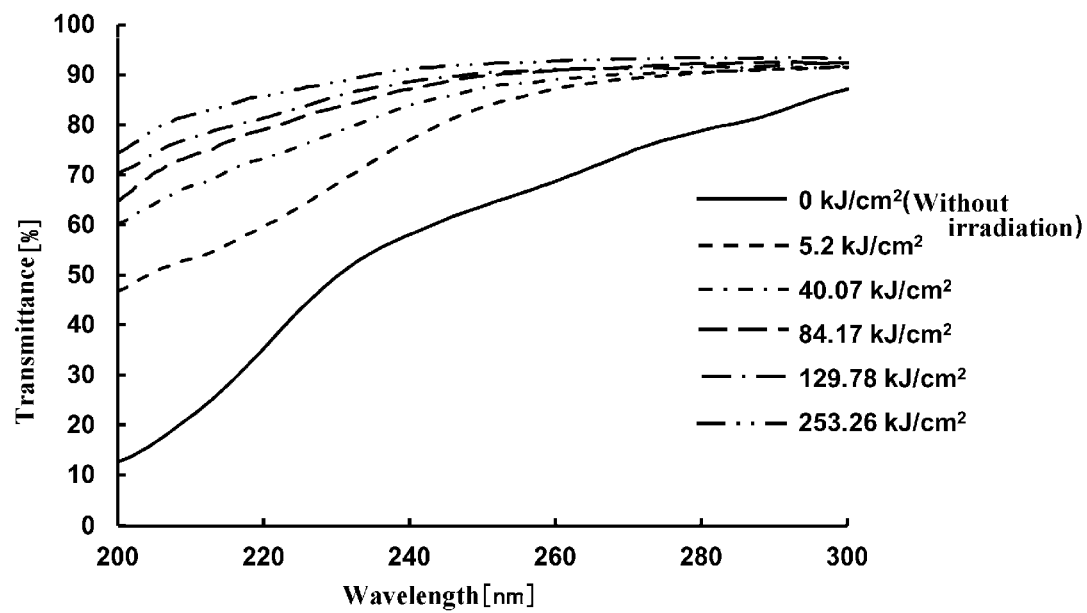

*Fig.4*
(a)
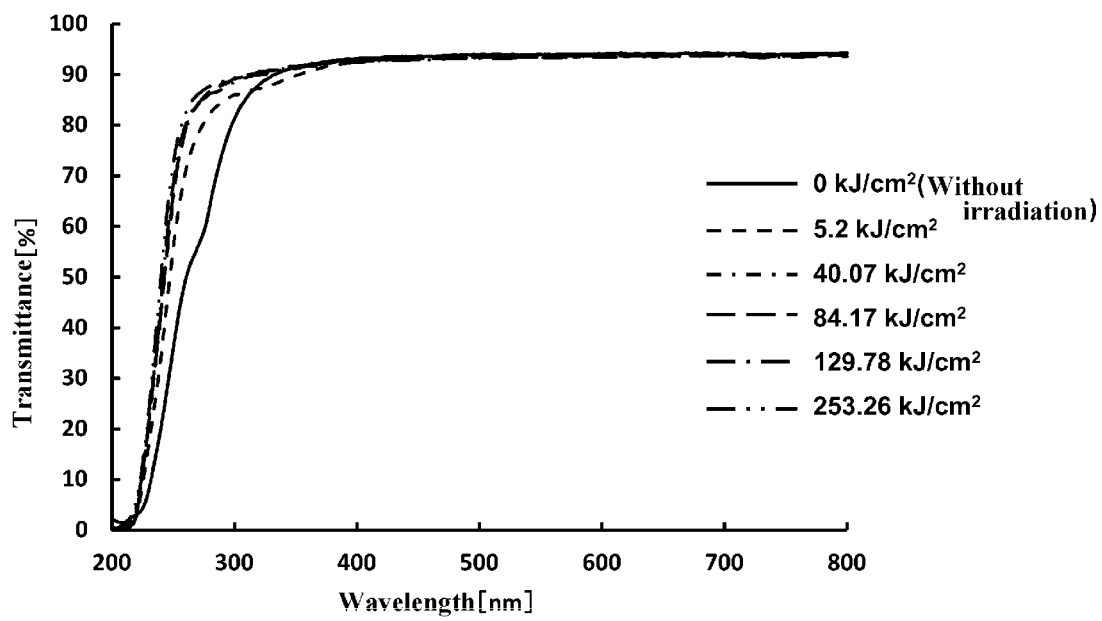
(b)
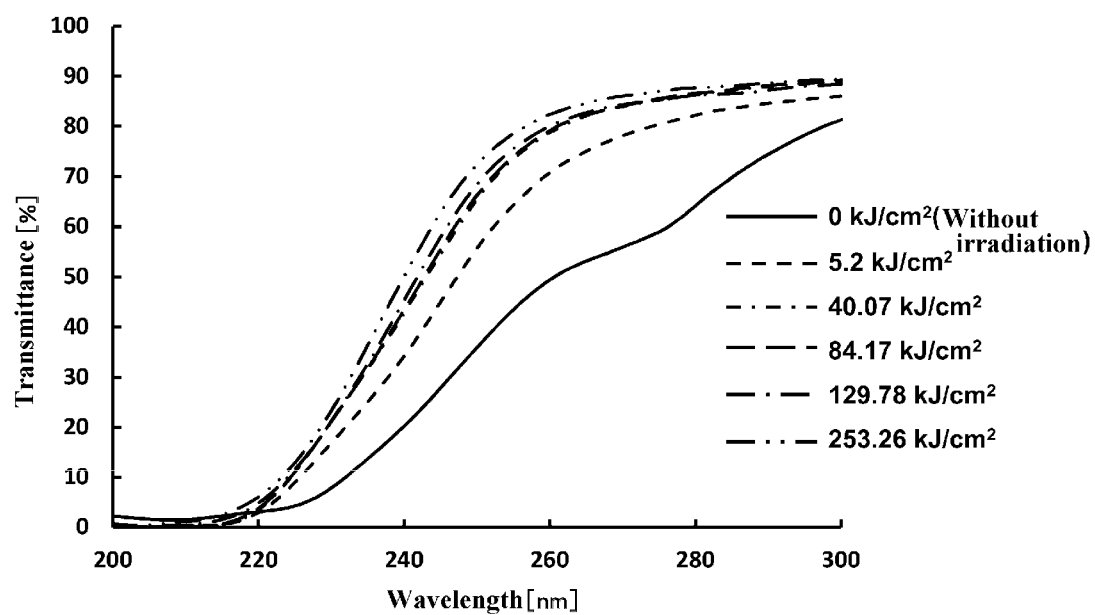

*Fig. 7*
(a-1)
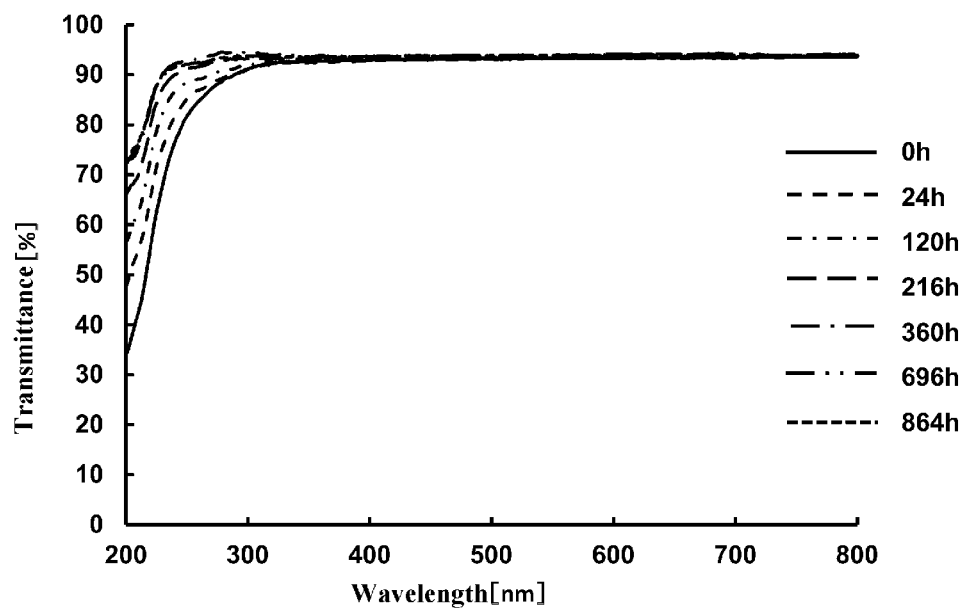
(a-2)
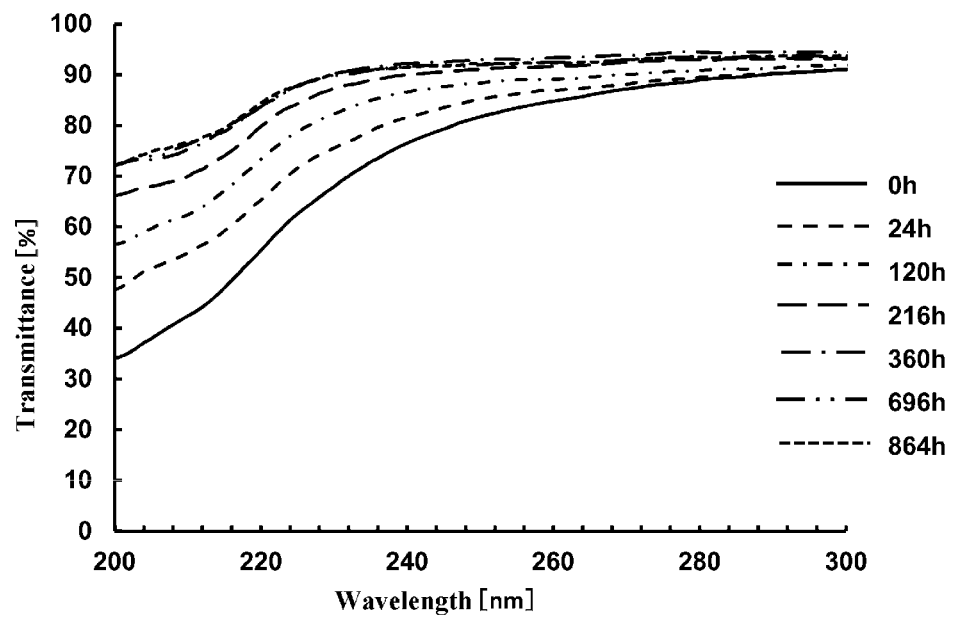

Fig.9
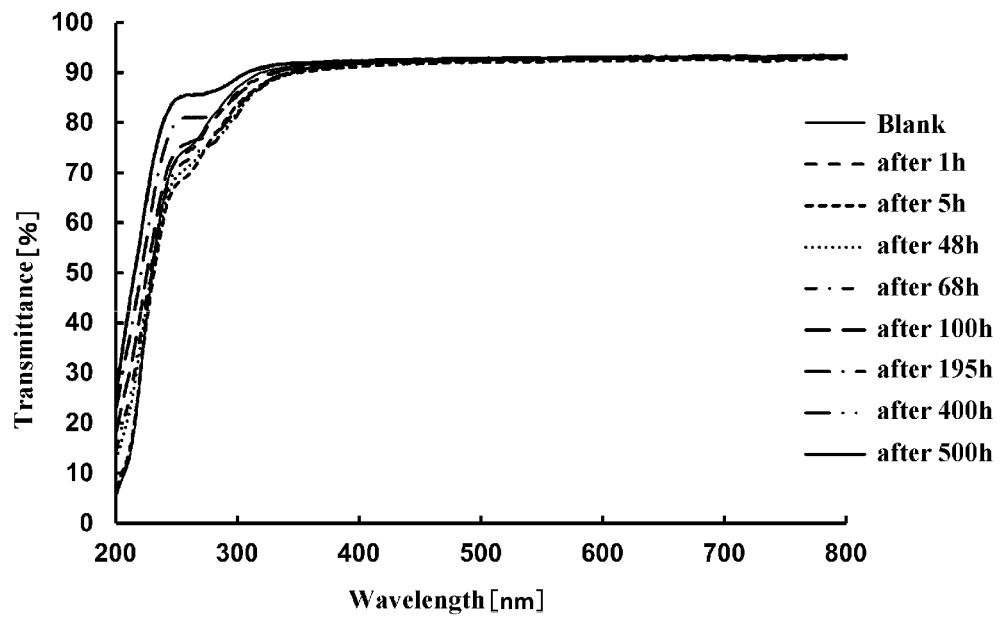
(a)
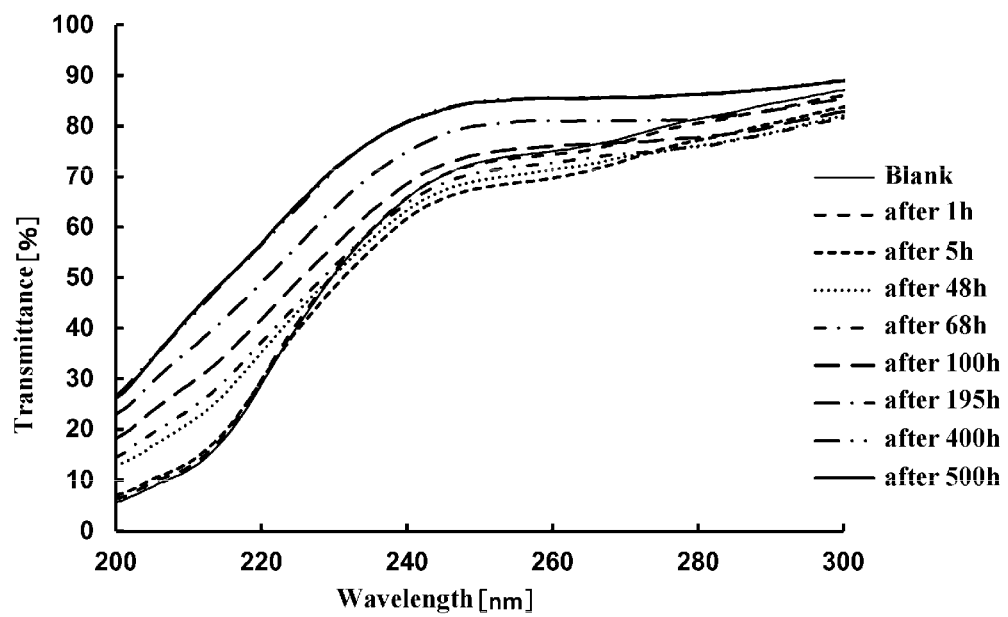
(b)

Fig.12
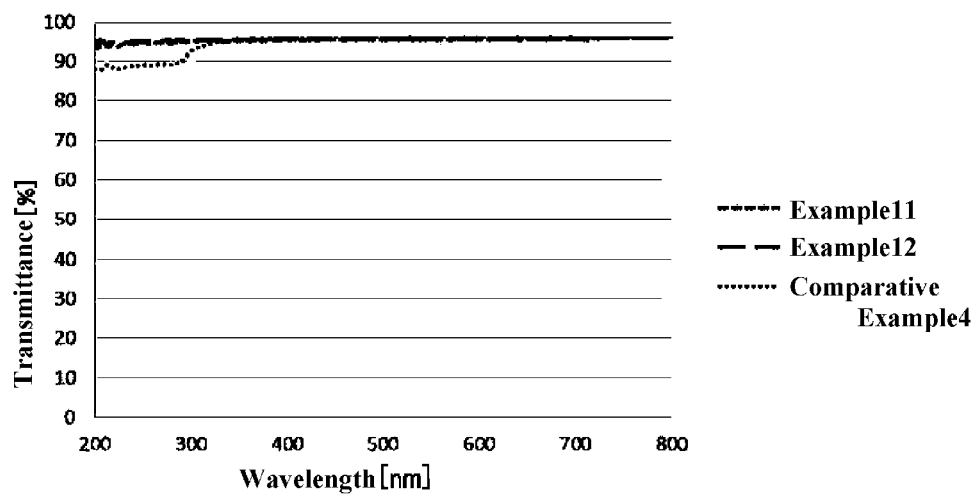
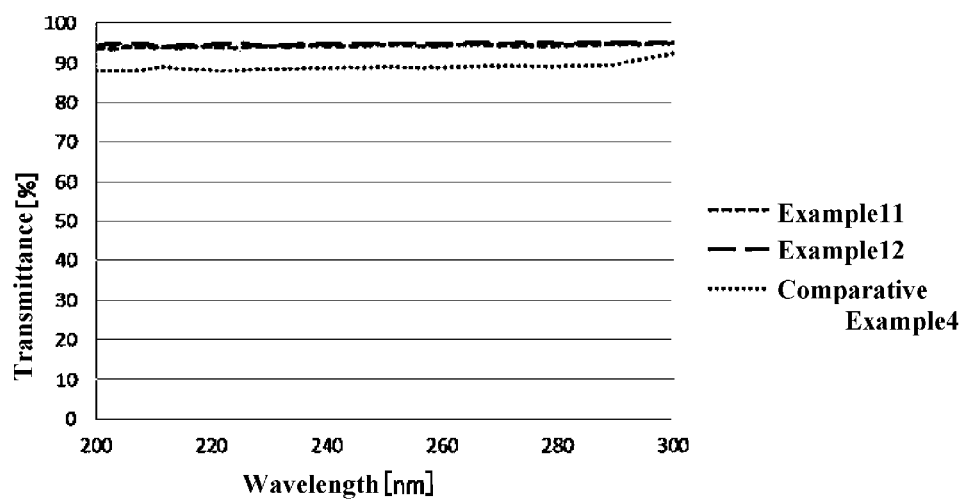

Fig.14
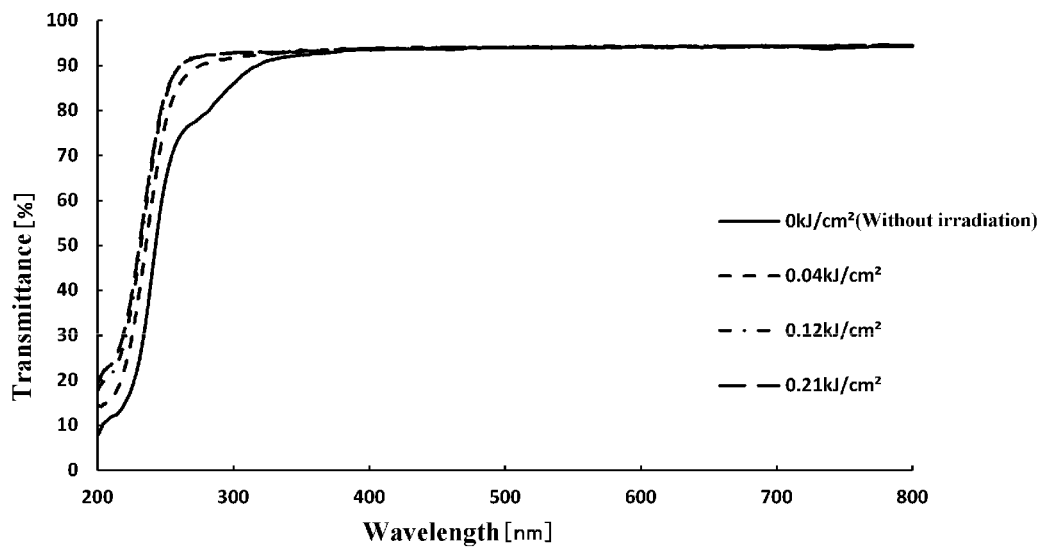
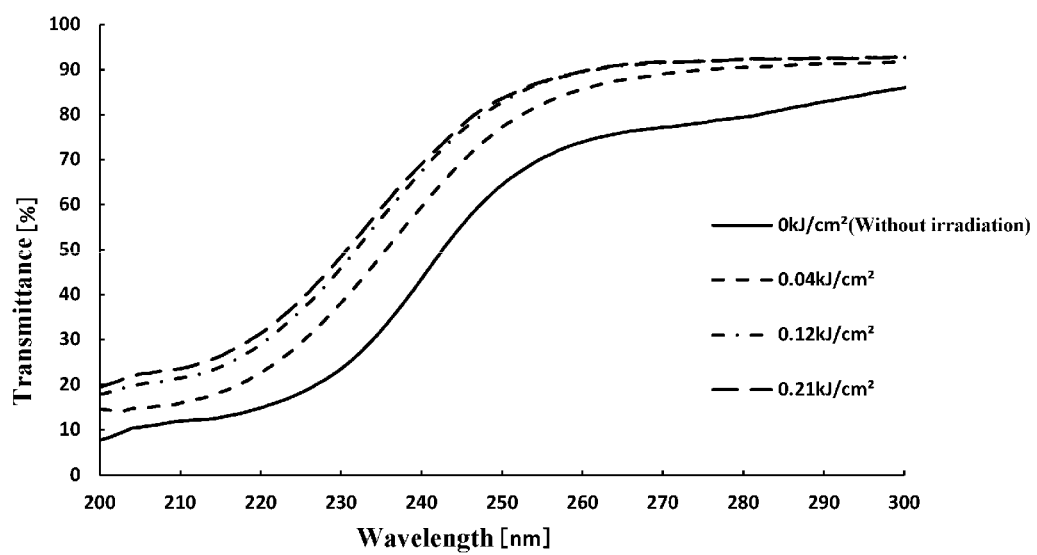

METHOD FOR MODIFYING OPTICAL PROPERTIES OF SYNTHETIC RESIN

TECHNICAL FIELD

The present invention relates to a method for modifying optical properties of a synthetic resin such that the synthetic resin has a high transmittance even in an ultraviolet wavelength range.

BACKGROUND ART

In recent years, ultraviolet rays have been utilized in various fields, and in particular, ultraviolet LEDs (UV-LEDs) which irradiate short-wavelength ultraviolet rays have been developed.

In general, the wavelength range of ultraviolet rays is distributed into UVA (ultraviolet A wave: wavelengths of 400 to 315 nm), UVB (ultraviolet B wave: wavelengths of 315 to 280 nm) and UVC (ultraviolet C wave: wavelengths of 280 to 100 nm). In solar rays, the UVC having high energy is absorbed by the ozone layer so as not to reach the surface of the earth whereas the UVA and the UVB reach the surface of the earth to be useful for the activation of vitamin D achieved by sunbathing, sterilization when laundry or bedding is dried, photosynthesis and the like. On the other hand, the UVA and the UVB are known to have influences such as sunburn, inflammation, spots, wrinkles and skin cancer development.

By utilization of the properties of ultraviolet rays as described above, artificial ultraviolet rays are industrially and daily used for various types of applications. For example, the wavelengths of the UVC are used in the fields of disinfection, sterilization and water and air purification, the wavelengths of the UVB are used in the fields of medicine and agriculture, and the wavelengths of the UVA are used in the fields of curing and bonding of resins, printing and painting.

Although ultraviolet lamps using mercury have been conventionally used as light sources for the ultraviolet rays described above, switching to ultraviolet LEDs is progressing due to environmental issues, power consumption and the like.

The ultraviolet LED has such advantages that its radiation wavelength width is narrow as compared with an ultraviolet lamp source which applies multiple wavelengths, its high power efficiency at a specific wavelength can contribute to energy saving, its lighting speed is fast, deterioration caused by the switching on and off of a power supply is prevented from occurring, the ultraviolet LED is easy to use due to its long life and high maintainability, a smaller, lighter and more flexible design can be made, and the ultraviolet LED is environmentally friendly because it does not use mercury so as not to impose an environmental load. On the other hand, the ultraviolet LED has such disadvantages that its output is significantly low as compared with the ultraviolet lamp and the price per unit light quantity is high.

Hence, in order to stably enhance the efficiency of light extraction in an LED device or an LED element, Patent Document 1 discloses a light emitting device that includes a mounting substrate, a light emitting element which is arranged on the mounting substrate to emit ultraviolet rays, a frame-shaped spacer which is arranged on the mounting substrate to surround the light emitting element, a cover which is arranged on the space to cover the light emitting element so as to transmit the ultraviolet rays emitted from the light emitting element, and a lens such as synthetic quartz which is arranged between the light emitting element and the cover. In the light emitting device, in the direction of thickness of the mounting substrate, the lens is opposite the light emitting element through only a space, and the spacer has a location structure for locating the lens in the direction of thickness and within a plane perpendicular to the direction of thickness.

Patent Document 2 discloses a light emitting device that includes a light source which emits a deep ultraviolet light and a luminous flux control member which is formed of a material having the property of increasing a transmittance for the deep ultraviolet light when the deep ultraviolet light is applied and which is used to control the distribution of the deep ultraviolet light.

PRIOR ART DOCUMENT

Patent Document

[Patent Document 1] JP2019-207956 A
[Patent Document 2] JP2020-9858 A

SUMMARY OF INVENTION

Problem to be Solved by the Invention

In the ultraviolet LED device, as in Patent Document 1, an optical member is mainly formed of an inorganic material such as synthetic quartz having a high transmittance in an ultraviolet range, and its manufacturing method is difficult to lower the flexibility of design, with the result that the optical member is expensive.

As in Patent Document 2, in the light emitting device including the luminous flux control member which is formed of the material having the property of increasing the transmittance for the deep ultraviolet light, properties such as the transmittance which are initially set by a designer disadvantageously change as the light emitting device is used.

The present invention is made to solve the problems described above, and an object thereof is to provide a method for modifying optical properties of a synthetic resin such that a transmittance is increased by modifying, removing or reducing factors which absorb wavelengths in the ultraviolet range and that it is possible to maintain stable and excellent reliability even after a long-term use.

Means to Solve the Above Problems

In a method for modifying optical properties of a synthetic resin which is made to achieve the object described above, a modification treatment, which is an energy irradiation treatment and is performed on a cured product made of a synthetic resin to increase a transmittance in an ultraviolet range.

In the method for modifying optical properties of synthetic resin described above, for example, the modification treatment which is at least one of a photo-oxidation treatment and a thermal oxidation treatment is performed on the cured product made of the synthetic resin to increase the transmittance.

Preferably, in the method for modifying optical properties of synthetic resin described above, in the modification treatment, the photo-oxidation treatment is a treatment which irradiates the cured product with rays of light having a wavelength of 360 nm or less, and the thermal oxidation treatment is a treatment which heats the cured product at 150 to 250° C.

In the method for modifying optical properties of synthetic resin described above, the modification treatment may be performed to increase a transmittance for modification by 5% or more on at least one of wavelengths of 200 to 280 nm in a deep ultraviolet range by 5% or more.

In the method for modifying optical properties of synthetic resin described above, the modification treatment is more preferably performed to provide an optical property for modification in which the transmittance on at least one of wavelengths of 200 to 280 nm in the deep ultraviolet range is at least 70%.

In the method for modifying optical properties of synthetic resin described above, in the photo-oxidation treatment, an irradiation energy is preferably at least 0.04 kJ/cm$^2$.

In the method for modifying optical properties of synthetic resin described above, the synthetic resin is at least one selected from the group consisting of a condensation polymerized silicone resin, an addition polymerized silicone resin, a radical polymerized silicone resin and an amorphous fluorine resin.

Preferably, in the method for modifying optical properties of synthetic resin described above, the synthetic resin is at least one selected from the group consisting of the condensation polymerized silicone resin, the addition polymerized silicone resin and the radical polymerized silicone resin, and the synthetic resin includes, among an M unit which is a monoorganosiloxy unit, a D unit which is a diorganosiloxy unit, a T unit which is a triorganosiloxy unit and a Q unit which is a siloxy unit, and at least one of the T unit and the D unit so as to provide the optical property.

More preferably, in the method for modifying optical properties of synthetic resin described above, the synthetic resin is a T unit-containing three-dimensional cross-linked silicone resin which is one selected from the group consisting of a T resin including the T unit, an MTQ resin including a combination of the M unit, the T unit and the Q unit, an MDTQ resin including a combination of the M unit, the D unit, the T unit and the Q unit, a DT resin including a combination of the D unit and the T unit and a TDQ resin including a combination of the D unit, the T unit and the Q unit.

In the method for modifying optical properties of synthetic resin described above, the synthetic resin is at least one selected from the group consisting of the condensation polymerized silicone resin, the addition polymerized silicone resin and the radical polymerized silicone resin, and at least a part of one of the M unit, the D unit and the T unit is changed by the modification treatment so as to provide the optical property.

In the method for modifying optical properties of synthetic resin described above, a Q structure and/or a glass structure is more preferably formed by the at least a part of one of the M unit, the D unit and the T unit so as to provide the optical property.

In the method for modifying optical properties of synthetic resin described above, the synthetic resin may be the amorphous fluorine resin, and the modification treatment may be performed to metamorphose, decompose, volatilize, reduce and/or remove a component of the fluorine resin or to structurally change or chemically change at least a part of the fluorine resin so as to provide the optical property.

In the method for modifying optical properties of synthetic resin described above, a raw material composition of the cured product may be subjected to forming, molding, applying, coating, and/or spraying so as to provide the cured product.

In the method for modifying optical properties of synthetic resin described above, a transmittance on at least one of wavelengths of 200 to 250 nm is more preferably at least 80%.

In the method for modifying optical properties of synthetic resin described above, a transmittance for a thickness of 1 mm on each of wavelengths of 250 to 300 nm is more preferably at least 90%.

Effects of the Invention

In the method for modifying optical properties of synthetic resin according to the present invention, the energy irradiation treatment such as the modification treatment which is at least one of the photo-oxidation treatment and the thermal oxidation treatment is performed to modify or remove or reduce factors which absorb wavelengths, and thus a product is made of a silicone resin which preferably includes the D unit and the T unit or only the T unit, preferably a silicon resin which has, as a main structure, a DT structure obtained by combining the D unit and the T unit and in which at least a part of a polysiloxane structure of the silicone resin is modified or an amorphous fluorine resin. In this way, the synthetic resin can be modified such that as compared with a product made of an unmodified silicone resin or an unmodified amorphous fluorine resin, a transmittance on at least one of wavelengths of 200 to 300 nm and 200 to 280 nm in particular in the deep ultraviolet range of the ultraviolet range is increased by 5% or more, preferably by 7% or more and further preferably by about 10% or more.

When the synthetic resin modified by the method for modifying optical properties of synthetic resin described above is an organic silicone resin, at least a part of the polysiloxane structure, for example, a silicone chain terminal or a methylsilyl group partway through the silicone chain and preferably at the silicone chain terminal is formed into a Q structure and/or a glass structure as a result of a methyl being cleaved by the photooxidation or thermal oxidation, and thus the transmittance in the ultraviolet range is increased and can be stably maintained without being metamorphosed rapidly even after long-term use, with the result that excellent reliability is provided.

In the synthetic resin modified by the method for modifying optical properties of synthetic resin described above, the photo-oxidation treatment and/or the thermal oxidation treatment is performed on the cured product which is cured by using a silicone resin, in particular, a condensation polymerized silicone resin, an addition polymerized silicone resin or a radical polymerized silicone resin and more particularly, a condensation-type silicone resin, in particular, an optical member, and thus the Q structure and/or the glass structure is formed by changing at least a part of an organic structure to an inorganic structure, with the result that a high transmittance is obtained preferably at wavelengths of 200 to 300 nm in the deep ultraviolet range and particularly even at wavelengths of 200 to 250 nm.

Here, the cured product refers to a cured product made of a synthetic resin which is cross-linked by a condensation polymerization reaction, an addition polymerization reaction or a radical polymerization reaction.

On the other hand, when the synthetic resin modified by the method for modifying optical properties of synthetic resin described above is a fluorine resin and preferably an amorphous fluorine resin, the component of the fluorine resin is metamorphosed, decomposed, volatilized, reduced and/or removed or at least a part of the fluorine resin is structurally changed or chemically changed, with the result that factors which absorb wavelengths in the ultraviolet range are modified or removed or reduced.

The synthetic resin modified by the method for modifying optical properties of synthetic resin described above can be used as a lens, a lens sheet, a lens array, a film or a light guide plate for performing light concentration, light scattering, diffusing, or light guiding while transmitting light at wavelengths of 200 to 300 nm in the deep ultraviolet range with a high transmittance. The modified molded optical member can also be used as a silicone resin coating or a coating member which covers a molded optical base member.

BRIEF DESCRIPTION OF DRAWINGS

FIG. 2 is a diagram showing transmittances for every irradiation energies of ultraviolet rays which are the results of the transmission evaluation test on the modified molded optical member using the method for modifying optical properties of synthetic resin to which the present invention is applied.

FIG. 4 is a diagram showing transmittances for every irradiation energies of ultraviolet rays which are the results of the transmission evaluation test on the modified molded optical member using the method for modifying optical properties of synthetic resin to which the present invention is applied.

FIG. 7 is a diagram showing transmittances for every ultraviolet irradiation times which are the results of the transmission evaluation test on the modified molded optical member using the method for modifying optical properties of synthetic resin to which the present invention is applied.

FIG. 9 is a diagram showing transmittances for every ultraviolet irradiation times which are the results of another transmission evaluation test on the modified molded optical member using the method for modifying optical properties of synthetic resin to which the present invention is applied.

FIG. 12 is a diagram showing a correlation between wavelengths and transmittances for every ultraviolet irradiation times which is the result of the transmission evaluation test on another modified synthetic resin using the method for modifying optical properties of synthetic resin to which the present invention is applied and another unmodified synthetic resin.

FIG. 14 is a diagram showing transmittances for every ultraviolet irradiation times which are the results of another transmission evaluation test on a modified molded optical member using the method for modifying optical properties of synthetic resin to which the present invention is applied.

EMBODIMENTS TO IMPLEMENT THE INVENTION

Figure 1:
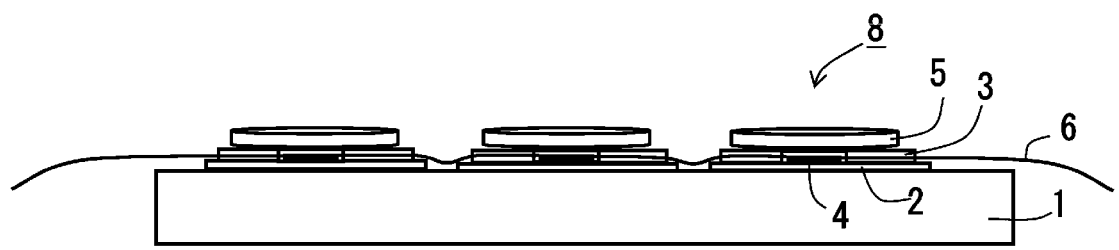
FIG. 1 is a diagram showing an outline of a test device for performing a transmission evaluation test on a modified molded optical member by using a method for modifying optical properties of a synthetic resin to which the present invention is applied.

Although an embodiment of the present invention will be described in detail below, the scope of the present invention is not limited to the embodiment described below.

In a method for modifying optical properties of a synthetic resin according to the present invention, to a cured product made of a synthetic resin, a modification treatment which is at least one of a photo-oxidation treatment and a thermal oxidation treatment is performed, and thus a transmittance on at least one of wavelengths of 200 to 250 nm in a deep ultraviolet range is increased by 5% or more, preferably by 7% or more and further preferably by 10% or more. A preferable example of the method for modifying optical properties of synthetic resin described above is that in order to manufacture a modified molded optical member which has a polysiloxane structure, is modified and is made of a silicon resin, the optical properties of the synthetic resin are modified. In the preferable example of the method for modifying optical properties of synthetic resin described above, among an M unit (M unit: 1 functional unit: $R_3SiO_{1/2}$), a D unit (D unit: 2 functional units: $R_2SiO_{2/2}$ unit), a T unit (T unit: 3 functional units: $R_1SiO_{3/2}$) and a Q unit (Q unit: 4 functional units: $SiO_{4/2}$) (in each case, R specifically represents an alkyl group such as a methyl group or an aryl group such as a phenyl group) represented by chemical formulae below, for the total molar ratio of all the T unit, the D unit, the M unit and the Q unit, the total molar ratio of the T unit or the D unit, or a T-D unit of a combination of the T unit and the D unit exceeds 50 mol %, and thus at least a part of the polysiloxane structure which is main structure of an organic silicone resin having a T unit repeat structure, a D unit repeat structure or a DT structure, for example, a methylsilyl group at a silicone chain terminal or through the silicone chain and preferably at the silicone chain terminal is formed into a Q structure and/or a glass structure as a result of a methyl being cleaved by photo-oxidation or thermal oxidation, with the result that the silicone resin modified by the photo-oxidation treatment and/or the thermal oxidation treatment is formed so as to provide an optical property in which the transmittance on at least one of wavelengths of 200 to 250 nm is increased by 5% or more to be at least 70%.

[Chemical Formula 1]

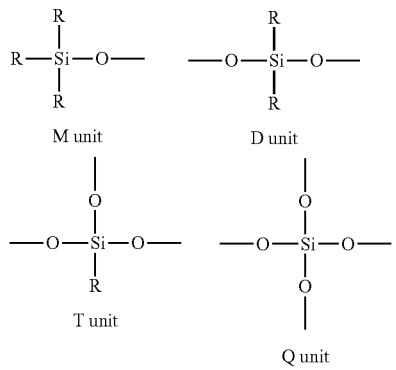

In the method for modifying optical properties of synthetic resin described above, as compared with a cured product made of an unmodified (that is, before modification) silicone resin, a transmittance on at least one of wavelengths in the deep ultraviolet range is preferably increased by 10% or more, and a transmittance at a wavelength of 250 nm is further preferably increased by 20% or more.

In the method for modifying optical properties of synthetic resin described above, as compared with the cured product made of the unmodified (that is, before modification) silicone resin, the photo-oxidation treatment and/or the thermal oxidation treatment is performed, and thus a transmittance on at least one of wavelengths of 200 to 300 nm and in particular 200 to 250 nm in the deep ultraviolet range of the ultraviolet range can be increased by 5% or more, preferably by 7% or more and further preferably by about 10% or more, and can be more preferably at least 70%.

In general, a silicone rubber or a silicone resin has a low transmittance in the ultraviolet range (in particular, UV-B and UV-C), therefore it has not been used as an optical member for a deep ultraviolet LED.

On the other hand, a material formed with only the Q structure is close to a so-called glass structure, and thus though the material has strong mechanical strength, it is difficult to mold the material like a resin.

By contrast, a molded optical member formed of a T unit-containing three-dimensional cross-linked silicone resin which has a T unit repeat structure and is selected from the group consisting of a T resin including the T unit, an MTQ resin including a combination of the M unit, the T unit and the Q unit, an MDTQ resin including a combination of the M unit, the D unit, the T unit and the Q unit, a DT resin including a combination of the D unit and the T unit and a TDQ resin including a combination of the D unit, the T unit and the Q unit, and preferably a base resin serving as a three-dimensional cross-linked silicone resin which is the DT resin, is excellent in moldability and visible light transmission unlike quartz glass or synthetic quartz glass. However, when the photo-oxidation treatment or the thermal oxidation treatment is not performed, the transmittance on at least one of wavelengths of 200 to 300 nm and 200 to 250 nm in particular in the deep ultraviolet range of the ultraviolet range is low.

An MQ resin formed with the M unit and the Q unit is so strong as to have satisfactory mechanical strength, but its film is so brittle as to make it difficult to form not only a self-supporting film but also a three-dimensional shape whereas as compared with the MQ resin, in the T resin, the MTQ resin, the MDTQ resin, the DT resin, the TQ resin and the TDQ resin, the flexibility of a film is enhanced, it is possible to form not only a strong self-supporting film having followability but also a three-dimensional shape, and resin-derived strength is also provided.

However, when the photo-oxidation treatment and/or the thermal oxidation treatment is performed on the molded optical member formed of the untreated specific base resin as described above, organic functional groups which form some Si—C bonds such as an alkyl group or a phenyl group bonded to the D unit and/or the T unit are eliminated, and thus the Q structure and/or the glass structure (i.e. Si=O structure or Si—OH structure) is provided, with the result that the Si groups thereof are mineralized to modify, remove or reduce the Si—C bond and the like which is considered to be a factor for absorbing wavelengths in the ultraviolet range. In this way, the transmittance in the ultraviolet range is increased. Consequently, it is possible to modify the molded optical member into a modified molded optical member in which stable properties are provided and a high transmittance is provided even in the ultraviolet range, while the transmittance in the visible range is maintained.

The base material of the optical member is a curable silicone resin having a polysiloxane structure, the ratio of a branch structure (T unit or Q unit) is 60% or more, and its hardness by Shore D after curing is 40 to 95, preferably 45 to 90 and more preferably 50 to 85.

When the base material of the optical member has the DT structure as a main structure, the ratio of the T unit to the untreated D unit is preferably 70 to 99%, more preferably 80 to 99% and further preferably 90 to 99%. When the structure is formed with only the T unit, the ratio of the T unit is 100%.

The base material of the optical member is especially a condensation polymerized silicone resin, and in particular, when the optical member is molded with a silicone resin formed with the DT structure and having a high ratio of the T unit, as compared with an optical member molded with another silicone rubber or a silicone resin such as an addition polymerized silicone resin, an addition polymerized silicone rubber, a radical polymerized silicone resin or a radical polymerized silicone rubber, both a high transmittance and moldability in the ultraviolet range can be achieved. In such a case, the ratio of the T unit to the untreated D unit is preferably 70 to 99%, more preferably 80 to 99% and further preferably 90 to 99%.

In the method for modifying optical properties of synthetic resin described above, it is estimated that by the photo-oxidation reaction or the thermal oxidation reaction, the organic group such as methyl at the silicone chain terminal or through the silicone chain and preferably at the silicone chain terminal is cleaved and oxidized, and thus a part of the organic silicone structure is formed into the Q structure and/or the glass structure to change into quartz glass, with the result that the transmittance in the deep ultraviolet range is increased.

In the silicone resin modified by the method for modifying optical properties of synthetic resin, when the ratios of Si element, O element and C element are compared from the results of an XPS measurement, as compared with the cured product on which the photo-oxidation treatment and/or the thermal oxidation treatment is not performed, in the cured product on which the photo-oxidation treatment and/or the thermal oxidation treatment is performed, the ratio of C element is reduced, and the ratio of O element is increased by 1% or more, preferably by 2% or more, further preferably by 3% or more and further more preferably by 4% or more.

In the method for modifying optical properties of synthetic resin, for example, an organic functional group at the silicone chain terminal or through the silicone chain, preferably at the silicone chain terminal is cleaved and oxidized, and thus a part of the organic silicone structure is formed into the Q structure and/or the glass structure, with the result that a transmittance on at least one of wavelengths of 200 to 250 nm is at least 80% and a transmittance for a thickness of 1 mm at each of wavelengths of 250 to 300 nm is at least 90%.

In the method for modifying optical properties of synthetic resin, when the thickness of the cured product of the synthetic resin before the modification treatment is 1 mm, a transmittance at a wavelength of 220 nm is 20%, and the transmittance is preferably increased by the modification treatment.

As a silicone resin raw material composition used for forming the modified molded optical member, in terms of increasing the transmittance in the ultraviolet range by the photo-oxidation treatment and/or the thermal oxidation treatment and reducing a curing time to enhance the manufacturing efficiency, a condensation polymerization-type silicone resin which can be condensed and cured is preferable.

More specifically, a polyorganosiloxane (such as a silicone resin) which has a siloxane bond of Si—O—Si in a main skeleton serving as a main chain as shown in the following chemical structural formulae is mentioned. In the following chemical structural formulae, X represents a monovalent unsubstituted group containing no aliphatic unsaturated group or an organic functional group such as a substituted hydrocarbon group. Examples of the X include: a hydroxy group; an alkyl group such as a methyl group, an ethyl group, a propyl group, a pentyl group, a butyl group, a pentyl group and a hexyl group; an aryl group such as a phenyl group, a tolyl group and a xylyl group; and a substituted hydrocarbon group such as a chloromethyl group, a 3-chloropropyl group and a 3-trifluoropropyl group. For the X, one type or a plurality of types may be provided. Most or all of the Xs are preferably a methyl group. O—R represents an alkoxysilyl group.

[Chemical Formula 2]

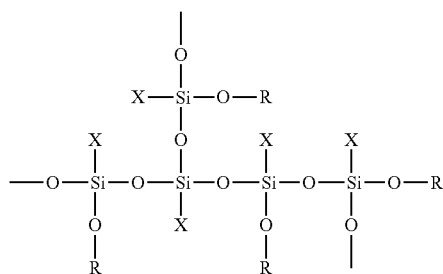

[Chemical Formula 3]

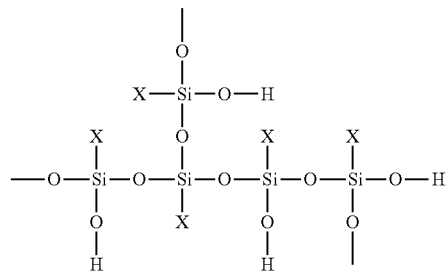

(in the formula, preferably, —O—R represents an alkoxysilyl group and —X represents an organic functional group such as a methyl group.)

The silicone resin of the raw material as described above preferably includes only 0.3 parts by mass at the maximum of a curing catalyst for forming of an organic compound including a siloxane bond and in particular, a C—C bond or a C=C bond with respect to 100 parts by mass of the silicone resin described above or does not include the curing catalyst.

Although as an example of the synthetic resin of the raw material in the method for modifying optical properties of synthetic resin described above, the condensation polymerized silicone resin is mentioned, the addition polymerized silicone resin, the radical polymerized silicone resin or the amorphous fluorine resin may be used.

As the condensation polymerized silicone resin, a silicone resin, in which a monomer species containing a vinylsilyl group or a vinylsiloxy group and a hydrosilyl group in separate monomer molecules or the same monomer molecule is additionally polymerized with vinyl and hydrosilyl, is mentioned.

As the radical polymerized silicone resin, an ultraviolet curable reaction-type silicone resin is mentioned.

As the amorphous fluorine resin, an amorphous fluorine resin "CYTOP" (tradename made by AGC Inc.) is mentioned in which perfluoro (4-vinyloxy-1-butene) is cyclepolymerized to provide a repeat structure shown in the following chemical formula. Specific examples include CYTOP A type (terminal functional group: —COOH), CYTOP M type (terminal functional group —CONH—Si(OR)$_n$) and CYTOP S type (terminal functional group —CF$_3$) (all made by AGC Inc.).

[Chemical Formula 4]

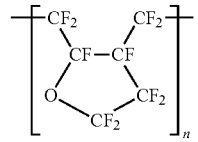

(in the formula, n represents the number of repeat units in the fluorine resin.)

In the method for modifying optical properties of synthetic resin, regardless of the type of raw material, or the wideness, hardness and thickness of the shape, unevenness or smoothness of the surface of a molded optical member formed of a base resin on which the photo-oxidation treatment and/or the thermal oxidation treatment is not performed, by liquid injection molding system (LIMS), molding, stamp molding using a pressing die, a roller and the like or coating such as spraying or applying and the raw material is polymerized into a three-dimensional cross-linked silicone resin, with the result that the cured product in the shape of a thin film having a thickness of 1 to 10 µm, a thick film or plate having a thickness of 100 mm or less (preferably several tens of millimeters) or in a three-dimensional shape may be provided.

Although the method for modifying optical properties of synthetic resin as described above is not particularly limited as long as the optical member is made of a synthetic resin such as the silicone resin or the fluorine resin in particular and has the optical properties described above, the optical member may be a lens: which is exemplified with a convex lens such as a biconvex lens, a plano-convex lens, a convex meniscus lens; a concave lens such as a biconcave lens, a plano-concave lens, a concave meniscus lens; an aspherical lens; a cylindrical lens; a toroidal lens; and a Fresnel lens, may be a lens sheet in the shape of a sheet, may be a lens array in which a large number of lenses described above are arranged, may be a film or may be a light guide plate. In the method for modifying optical properties of synthetic resin, an optical member may be used which covers a molded optical base material made of a resin similar to or different from the silicone resin described above or made of quartz glass, specific examples include a coating made of the silicone resin described above, a coating member such as a coating layer or a satin coating layer and a coating member having a condensing property or a light diffusing property and a hybrid lens which covers the molded optical base material may be used.

In an ultraviolet irradiation device using the cured product obtained by the method for modifying optical properties of synthetic resin, for example, the cured product or more specifically, the modified molded optical member described above is arranged in the direction of irradiation of an ultraviolet light source, and thus ultraviolet rays from the ultraviolet light source are transmitted, and thus it is possible to irradiate rays at desired wavelengths in the deep ultraviolet range.

The method for modifying optical properties of synthetic resin as described above may include: a step in which a molded optical member raw material that is made of a silicone resin having a polysiloxane structure formed of only a T unit among the T unit, a D unit, an M unit and a Q unit or is made of a silicone resin having a polysiloxane structure using, as a main structure, a DT structure of a combination of the T unit and the D unit is formed by injection molding, stamp molding or coating; and a step in which energy irradiation treatment such as plasma, corona discharge, an electron beam, xenon, maxim laser, radiation, ultraviolet rays or deep ultraviolet rays, for example, a photo-oxidation treatment at wavelengths of 360 nm or less affecting a Si—C bond, preferably at wavelengths of 200 to 360 nm, more preferably at wavelengths of 250 to 360 nm and further preferably at wavelengths of 260 to 360 nm is performed and/or a thermal oxidation treatment is performed at 150 to 250° C., preferably at 200±20° C. and more preferably at 200° C. for 3 hours or more, preferably for 6 hours or more, more preferably for 12 hours or more and further preferably for 24 hours or more to change at least a part into a Q structure and/or a glass structure.

In the photo-oxidation treatment, when the irradiation energy is 0.04 kJ/cm$^2$ or more, preferably 0.12 kJ/cm$^2$ or more and further preferably 0.21 kJ/cm$^2$ or more, or the irradiation energy is 5 kJ/cm$^2$ or more, 40 kJ/cm$^2$ or more, 80 kJ/cm$^2$ or more or 120 kJ/cm$^2$ or more, the transmittance in the ultraviolet range can be increased. The irradiation energy is calculated by the following formula.

Irradiation energy [kJ/cm$^2$]=Irradiation intensity [mW/cm$^2$]×Irradiation time[s]

In the method for modifying optical properties of synthetic resin as described above, as the irradiation intensity of ultraviolet rays is increased, the irradiation time can be reduced, with the result that the irradiation intensity can be set as necessary.

In the method for modifying optical properties of synthetic resin described above, the optical properties are modified such that a transmittance on at least one of wavelengths of 200 to 250 nm in the deep ultraviolet range is increased by 5% or more, preferably by 7% or more and further preferably by 10% or more.

EMBODIMENTS

Examples in a method for modifying optical properties of synthetic resin to which the present invention is applied and Reference Examples to which the modifying method is not applied will be described in detail below.

Example 1A

As a raw material in Example 1, a silicone resin (product number YR3370 made by Momentive Performance Materials Inc.) which was white solid (flake) and in which all organic substituents were methyl groups, was used.

A method for molding a test sample was as follows.

4 g of the raw material (YR3370) was weighed, was put into a mold for forming a circular flat plate-shape and was heated to be cured, and thus an untreated test sample having a thickness of 1 to 2 mm in Example 1A was obtained.

Example 1B

As a raw material in Example 1B, instead of the silicone resin YR3370 in Example 1A, a commercially available addition polymerization-type silicone resin (product number MS1001 made by Dow Toray Co., Ltd.), which was excellent in durability, was capable of being formed into a fine shape, had medium viscosity/medium hardness, in which a two-component mixing ratio was 1:1 and which was intended for use in fast-curing optical molding, was used. 4 g thereof was weighed, was put into a mold for forming a circular flat plate-shape and was heated to be cured and thus a test sample having a thickness of 1 to 2 mm in Example 1B was obtained.

(Transmission Evaluation Test 1)

As a transmission evaluation test environment, as shown in FIG. 1, an aluminum plate 2 was placed on a cooling chiller 1 for reducing influence caused by heat generation, a spacer 3 having a circular hole and a deep ultraviolet UV-C LED (product number NCSU334A made by Nichia Corporation) serving as an ultraviolet LED 4 which was stored in the hole were placed on the aluminum plate 2, the ultraviolet LED 4 was connected to a power supply with a wiring code 6, and the test samples in Example 1A and Example 1B were installed immediately on the ultraviolet LED 4, with the result that a test device 8 was prepared. The spacer 3 was used to set a distance between the ultraviolet LED 4 and the test sample 5 to 2 mm. The test device described above was put into an oven, ultraviolet rays having an irradiation energy of 5.2 to 253.26 kJ/cm$^2$ were irradiated in an atmospheric environment of 85° C., and a transmission evaluation test for measuring variations in transmittance was performed on the test sample on which the irradiation treatment was performed.

The test conditions of the transmission evaluation test were as follows.
- Rated current value: 350 mA
- Rated forward voltage: 5.2 V
- Peak wavelength: 280 nm
- Irradiation intensity to test sample: maximum intensity of 70 to 90 mW/cm$^2$
- Irradiation intensity measuring devices: UIT-250 and UVD-S254 (made by USHIO INC.)

The measurement of the transmittance was performed on the test samples in Examples 1A and 1B by using a spectrophotometer UV-3600Plus and an integrating sphere unit (product number ISR-1503 made by Shimadzu Corporation) after ultraviolet irradiation for 21 hours (irradiation energy of 5.2 kJ/cm$^2$), after ultraviolet irradiation for 159 hours (irradiation energy of 40.07 kJ/cm$^2$), after ultraviolet irradiation for 334 hours (irradiation energy of 84.17 kJ/cm$^2$), after ultraviolet irradiation for 515 hours (irradiation energy of 129.78 kJ/cm$^2$) and after ultraviolet irradiation for 1005 hours (irradiation energy of 253.26 kJ/cm$^2$).

As Reference Examples 1A and 1, the measurement was also performed on unmodified test samples in Examples 1A and 1B, that is, without ultraviolet irradiation (0 kJ/cm$^2$, 0 hour: blank).

Figure 3:
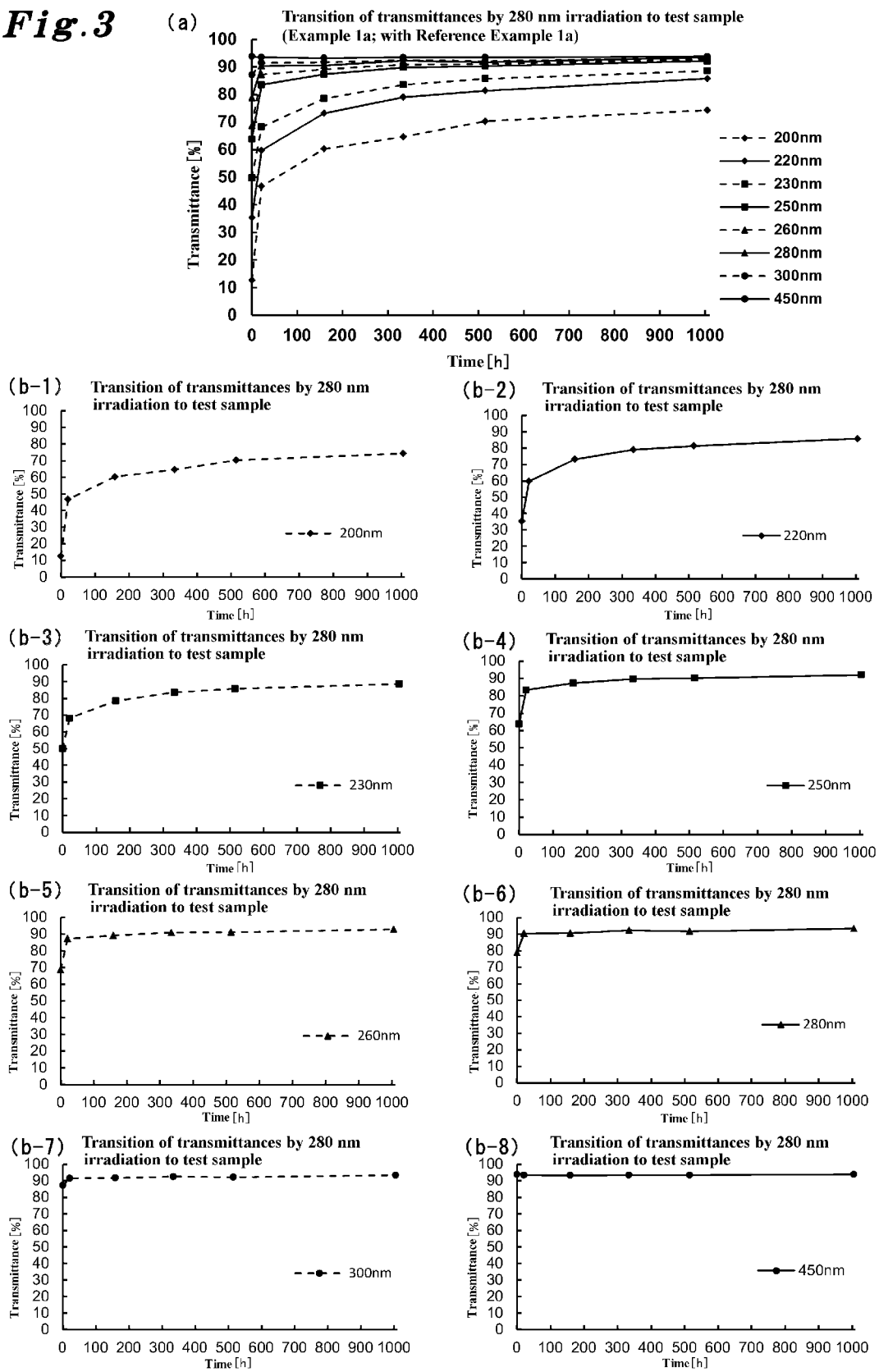
FIG. 3 is a diagram showing a correlation between ultraviolet irradiation times and transmittances at every wavelengths which is the result of the transmission evaluation test on the modified molded optical member using the method for modifying optical properties of synthetic resin to which the present invention is applied.
Figure 5:
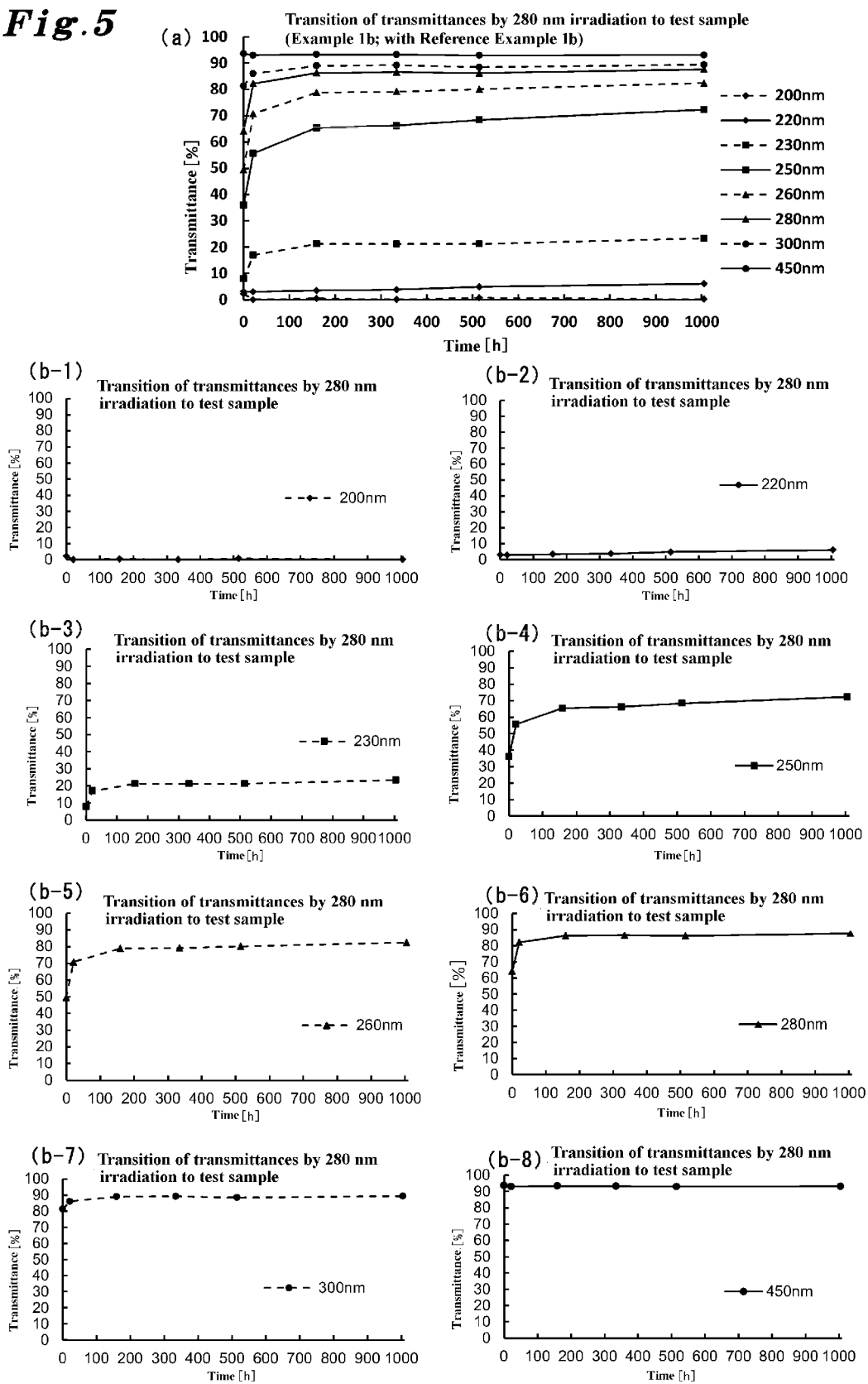
FIG. 5 is a diagram showing a correlation between ultraviolet irradiation times and transmittances at every wavelengths which is the result of the transmission evaluation test on the modified molded optical member using the method for modifying optical properties of synthetic resin to which the present invention is applied.

In the results of the transmission evaluation test, transmittances at wavelengths of 200 to 800 nm in Reference Example 1A without ultraviolet irradiation and transmittances at wavelengths of 200 to 800 nm after photo-oxidation treatment for irradiating ultraviolet rays at a wavelength of 280 nm in Example 1A are shown in FIG. 2(a), and enlarged views in the transmittances at wavelengths of 200 to 300 nm are shown in FIG. 2(b). FIG. 3(a) shows, in Reference Example 1A without ultraviolet irradiation and Example 1A, times (0 hour, 21 hours, 159 hours, 334 hours, 515 hours and 1005 hours) for the photo-oxidation treatment at a wavelength of 280 nm and transmittances at specific wavelengths (200 nm, 220 nm, 230 nm, 250 nm, 260 nm, 280 nm, 300 nm and 450 nm), and FIGS. 3(b-1) to 3(b-8) separately show the transmittances at the wavelengths. Transmittances at wavelengths of 200 to 800 nm in Reference Example 1B without ultraviolet irradiation and transmittances at wavelengths of 200 to 800 nm after the photo-oxidation treatment at a wavelength of 280 nm in Example 1B are shown in FIG. 4(a), and enlarged views in the transmittances at wavelengths of 200 to 300 nm are shown in FIG. 4(b). FIG. 5(a) shows, in Reference Example 1B without ultraviolet irradiation and Example 1B, times for the photo-oxidation treatment at a wavelength of 280 nm and transmittances at wavelengths of 200 nm, 220 nm, 230 nm, 250 nm, 260 nm, 280 nm, 300 nm and 450 nm, and FIGS. 5(b-1) to 5(b-8) separately show the transmittances at the wavelengths.

As shown in FIGS. 2 and 3, in Reference Example 1A without ultraviolet irradiation (0 kJ/cm$^2$, 0 hour), the transmittances at wavelengths of about 310 to 800 nm were 90% or more but the transmittances at wavelengths from about 310 to 200 nm were gradually lowered to about 10%. However, in Example 1A in which ultraviolet rays were irradiated, as the ultraviolet irradiation time was extended to 1005 hours, the transmittances at wavelengths of 200 to 300 nm were increased. In particular, at the wavelength of 200 nm, after ultraviolet irradiation for 21 hours, the transmittance was increased to about 50%. After ultraviolet irradiation for 159 hours, the transmittance was increased to about 60%. And after ultraviolet irradiation for 1005 hours, the transmittance was increased to about 75%. The same tendency was shown for ultraviolet rays having wavelengths of 200 to 300 nm. In particular, when ultraviolet rays were irradiated for 515 hours, the transmittances at wavelengths of 200 to 300 nm and in particular, the transmittance even at a wavelength of 200 nm was 70% or more. Therefore, in the test sample of Example 1A, the transmittances at wavelengths of 200 to 300 nm were significantly increased.

On the other hand, as shown in FIGS. 4 and 5, in Reference Example 1B without ultraviolet irradiation (0 kJ/cm$^2$, 0 hour), the transmittances at wavelengths of about 330 to 800 nm were 90% or more without ultraviolet irradiation (0 hour) but the transmittances at wavelengths from about 330 to 220 nm were gradually lowered to about 5%. However, in Example 1B in which ultraviolet rays were irradiated, as the ultraviolet irradiation time was extended to 1005 hours, the transmittances at wavelengths of 220 to 300 nm were increased. At the wavelength of 220 nm, the transmittance thereof was not significantly increased until ultraviolet irradiation for 1005 hours as compared to Example 1A but was increased to about 10%. Therefore, in the test sample of Example 1B, the transmittances at wavelengths of 220 to 300 nm were increased, and the transmittances even at wavelengths of 250 to 280 nm were increased by 10% or more as compared with the case in which ultraviolet rays were not irradiated.

Examples 2 to 7

On the untreated test samples which were produced in Example 1A, photo-oxidation treatment and/or thermal oxidation treatment shown in Table 1 below was performed for a predetermined time to perform modification treatment, and then a test was performed. The photo-oxidation treatment was the same as in the transmission evaluation test 1.

Specifically, in the thermal oxidation treatment, heating was performed within an oven at 200° C.

Figure 6:
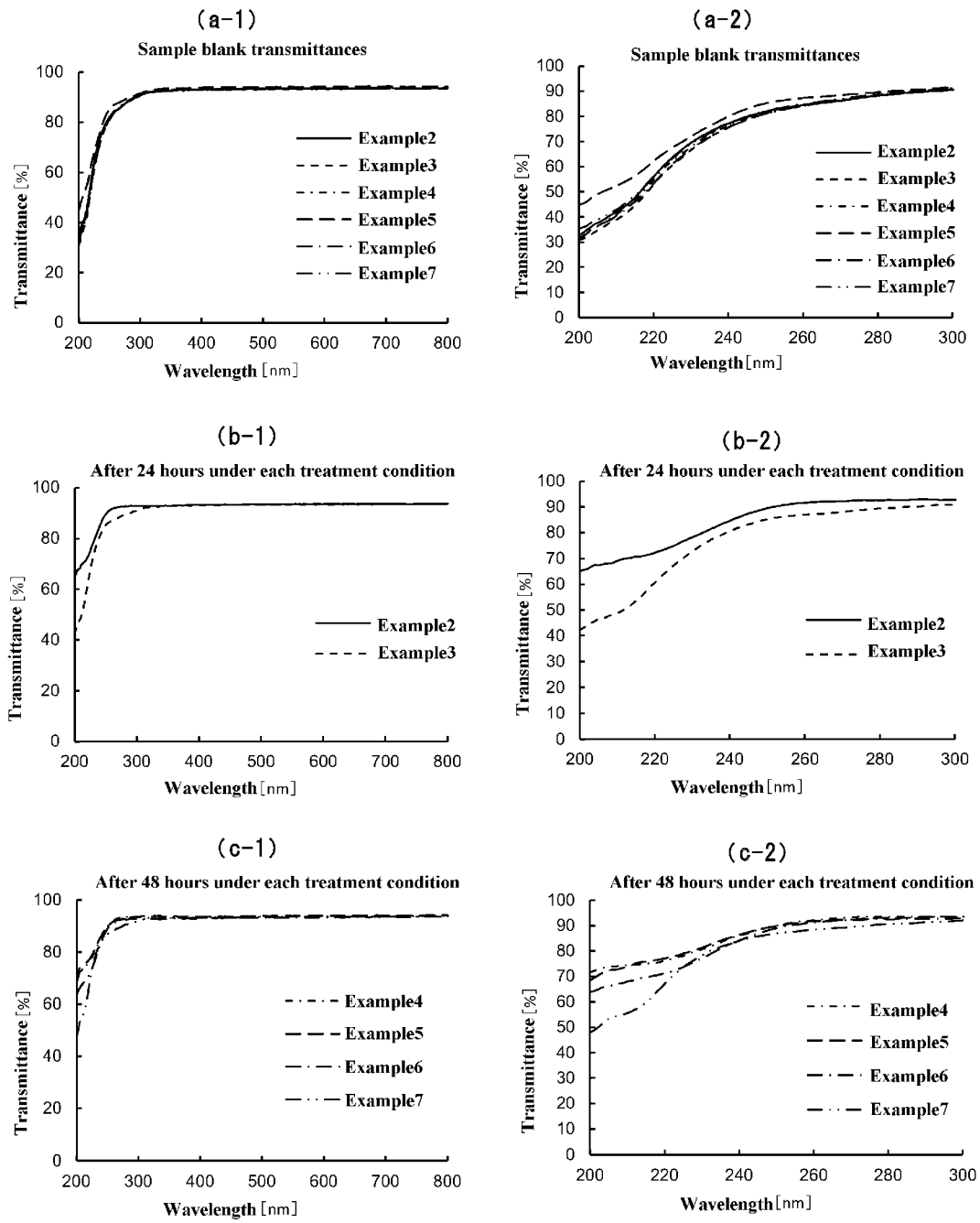
FIG. 6 is a diagram showing transmittances after ultraviolet irradiation treatment and/or thermal treatment which are the results of another transmission evaluation test on the modified molded optical member using the method for modifying optical properties of synthetic resin to which the present invention is applied.

The results thereof are shown in FIG. 6 (a-1: test sample blank transmittances at wavelengths of 200 to 800 nm, a-2: enlarged views in test sample blank transmittances at wavelengths of 200 to 300 nm), FIG. 6 (b-1: test sample transmittances at wavelengths of 200 to 800 nm after 24 hours under each of treatment conditions, b-2: test sample transmittances at wavelengths of 200 to 300 nm after 24 hours under each of treatment conditions) and FIG. 6 (c-1: test sample transmittances at wavelengths of 200 to 800 nm after 48 hours under each of treatment conditions, c-2: test sample transmittances at wavelengths of 200 to 300 nm after 48 hours under each of treatment conditions).

TABLE 1

| | Treatment conditions | Treatment time |
|---|---|---|
| Example 2 | UV 280 nm irradiation | 24 hours |
| Example 3 | Thermal oxidation treatment | 24 hours |
| Example 4 | Thermal oxidation treatment then | 24 hours+ |
| Example 5 | UV 280 nm irradiation then | 24 hours+ |
| Example 6 | UV 280 nm irradiation | 48 hours |
| Example 7 | Thermal oxidation treatment | 48 hours |

As shown in FIG. 6, in any of the photo-oxidation treatment in which ultraviolet rays at a wavelength of 280 nm were irradiated and the thermal oxidation treatment at 200° C., the ultraviolet transmittances for the test samples were confirmed to be increased. It was confirmed that the photo-oxidation treatment and the thermal oxidation treatment were combined and thus the ultraviolet transmittances were efficiently increased.

Example 8

A test device for Example 8 was prepared as in Example 1A except that the thermal oxidation treatment was performed for 864 hours as in Example 7 on the untreated test sample produced in Example 1A to perform the modification treatment, and thereafter a test was performed as in the transmission evaluation test 1.

The results of transmittances after the thermal oxidation treatment for 24 hours, 120 hours, 216 hours, 360 hours, 696 hours and 864 hours are shown in FIG. 7 (a: test sample transmittances at wavelengths of 200 to 800 nm for every thermal oxidation treatment times, b: test sample transmittances at wavelengths of 200 to 300 nm for the every thermal oxidation treatment times).

As Reference Example 2, the measurement was also performed on the unmodified test sample in Example 1A, that is, without ultraviolet irradiation (0 hour: blank).

As shown in FIG. 7, as the thermal oxidation treatment time was extended, the transmittance even at a wavelength of 200 nm on a low wavelength side was increased. Although in particular, at a wavelength of 200 nm, the transmittance was about 30% or more several % without treatment, the transmittance was increased to about 70% or more several % after the thermal oxidation treatment for 864 hours.

Example 9: Reference Example

Figure 8:
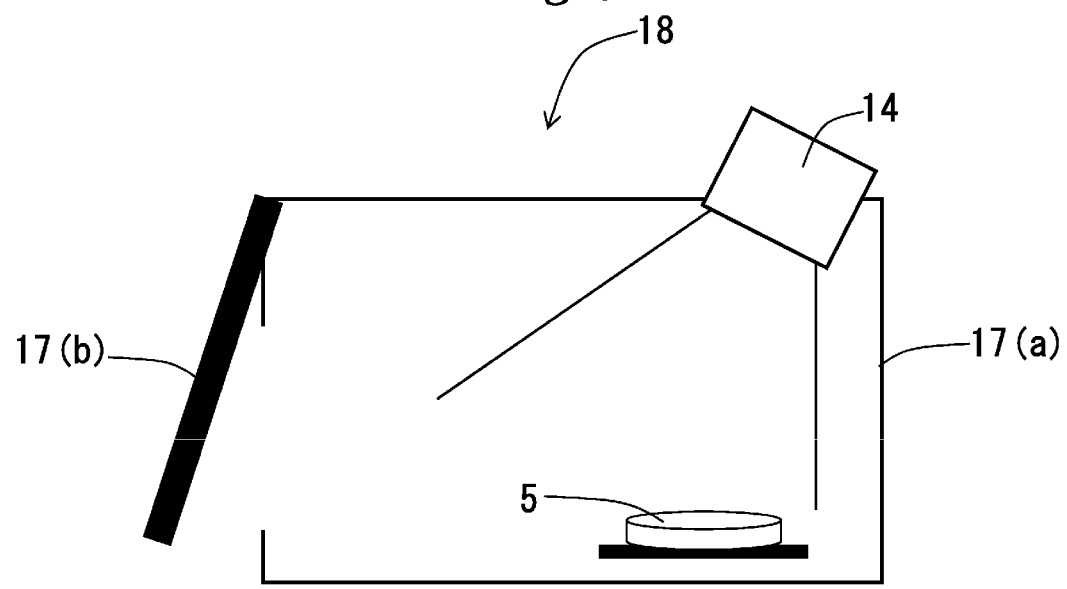
FIG. 8 is a diagram showing an outline of a test device for performing a transmission evaluation test on the modified molded optical member using the method for modifying optical properties of synthetic resin to which the present invention is applied.

On the untreated test sample 5 produced in Example 1A, as shown in FIG. 8, an irradiation facility 18 was used, the test sample 5 was put from an in/out window into a dark room 17(a) to be placed, and a blackout curtain 17(b) was used to block the in/out window, ultraviolet rays having a peak wavelength of 254 nm were irradiated from an ultraviolet light source 14 (tradename: Handy UV Lamp SUV-6 made by AS ONE Corporation) provided on the ceiling of the dark room 17(a) over a distance of 170 mm between the light source and the test sample with an irradiation intensity of 0.2 mW/cm² toward the test sample 5 for predetermined times of 0 (blank: control) to 500 hours, with the result that the test sample 5 was modified.

(Transmission Evaluation Test 2)

As irradiation intensity measuring devices, UIT-250 and UVD-S254 (made by USHIO INC.) were used, predetermined irradiation times were set to 1 hour, 5 hours, 48 hours, 68 hours, 100 hours, 195 hours, 400 hours and 500 hours and the measurement of transmittances was performed with the spectrophotometer.

As Reference Example 3, the measurement was also performed on the unmodified test sample in Example 1A, that is, without ultraviolet irradiation (0 hour: blank).

Figure 10:
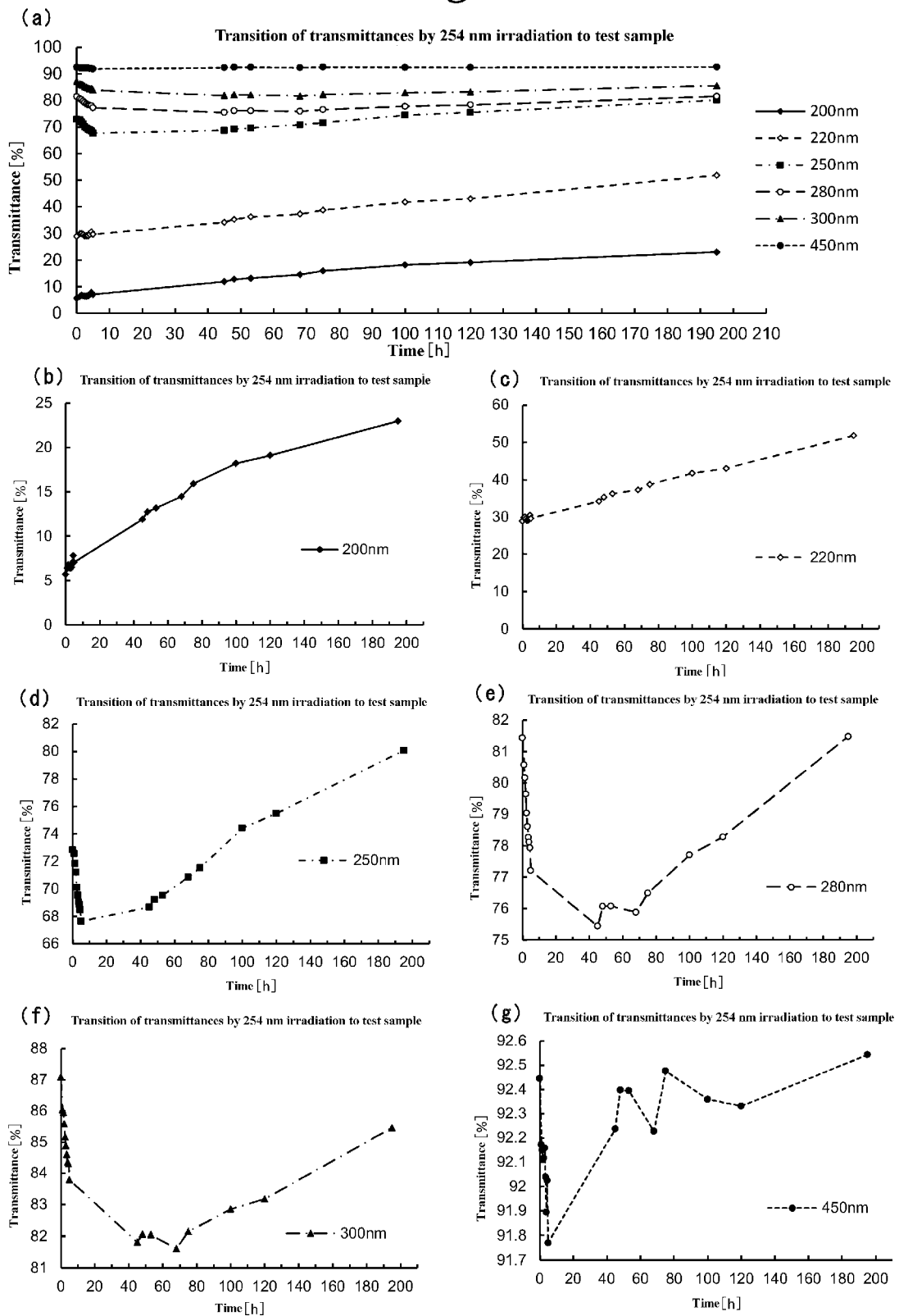
FIG. 10 is a diagram showing a correlation between every ultraviolet irradiation times and transmittances at specific wavelengths which is the result of another transmission evaluation test on the modified molded optical member using the method for modifying optical properties of synthetic resin to which the present invention is applied.

The results thereof are shown in FIGS. 9 and 10. FIG. 9(a) shows transmittances at wavelengths of 200 to 800 nm after ultraviolet irradiation for 0 to 500 hours, FIG. 9(b) shows transmittances (enlarged view) at wavelengths of 200 to 300 nm after ultraviolet irradiation for 0 to 68 hours, and FIG. 9(c) shows transmittances (enlarged view) at wavelengths of 200 to 300 nm after ultraviolet irradiation for 0 hour, 5 hours, 53 hours, 100 hours, 120 hours and 195 hours. FIG. 10(a) shows the transition of transmittances at wavelengths of 200 nm, 220 nm, 250 nm, 280 nm, 300 nm and 450 nm after ultraviolet irradiation for each of times, and FIGS. 10(b) to 10(g) show the transition of transmittances at (b) wavelength of 200 nm, (c) wavelength of 220 nm, (d) wavelength of 254 nm, (e) wavelength of 280 nm, (f) wavelength of 300 nm and (g) wavelength of 450 nm for ultraviolet irradiation times of 0 to 210 hours.

As shown in FIGS. 9 and 10, though ultraviolet rays (peak wavelength of 254 nm) were irradiated for the preparation of the test sample in Example 8, even when the irradiation intensity was so low as to be 0.2 mW/cm², the transmittances were increased depending on the irradiation time, with the result that it was shown that the test sample was modified. However, since the irradiation energy of the ultraviolet rays to the test sample was low, it took time to increase the transmittances. It was found that under the test sample preparation conditions described above, the transmittances were increased after ultraviolet irradiation with the irradiation intensity of 0.2 mW/cm² for about 50 hours (irradiation energy of 0.04 kJ/cm²).

It is estimated from FIGS. 10(d) to 10(g) that the reason why the transmittances was lower than before the ultraviolet irradiation when the irradiation energy was low, was that organic functional groups produced by the modification were left.

Comparative Example 1

Although it was found from the irradiation of ultraviolet rays of different wavelengths on the test samples molded in Examples 1A, 1B and 2 to 8 that the transmittances were increased even when ultraviolet rays having a wavelength of 254 nm were irradiate, in order for influence caused by molding to be examined, after ultraviolet rays were irradiated to the powdered raw material before molding, a test sample was molded and transmittances were measured.

10 g of the powdered material of the raw material (YR3370) was weighed and placed on a plate over which aluminum foil was spread instead of the test sample 5 in FIG. 6 (a distance from the light source to the powdered material was 170 mm). The ultraviolet light source (product number: Handy UV Lamp SUV-6 made by AS ONE Corporation) was used to irradiate ultraviolet rays having a wavelength of 254 nm with an irradiation intensity of 0.2 mW/cm² for predetermined times (45 hours and 500 hours), and thereafter, as in Example 1A, the test sample in Comparative Example 1 was produced.

As Reference Example 4, the measurement was also performed on the unmodified test sample in Comparative Example 1, that is, without ultraviolet irradiation (0 hour: blank).

(Transmission Evaluation Test 3)

As irradiation intensity measuring devices, UIT-250 and UVD-S254 (made by USHIO INC.) were used, the test sample in Comparative Example 1 produced from the raw material to which ultraviolet rays were previously irradiated was used and furthermore, the measurement of transmittances was performed using the spectrophotometer without the ultraviolet irradiation modification treatment being performed.

Figure 11:
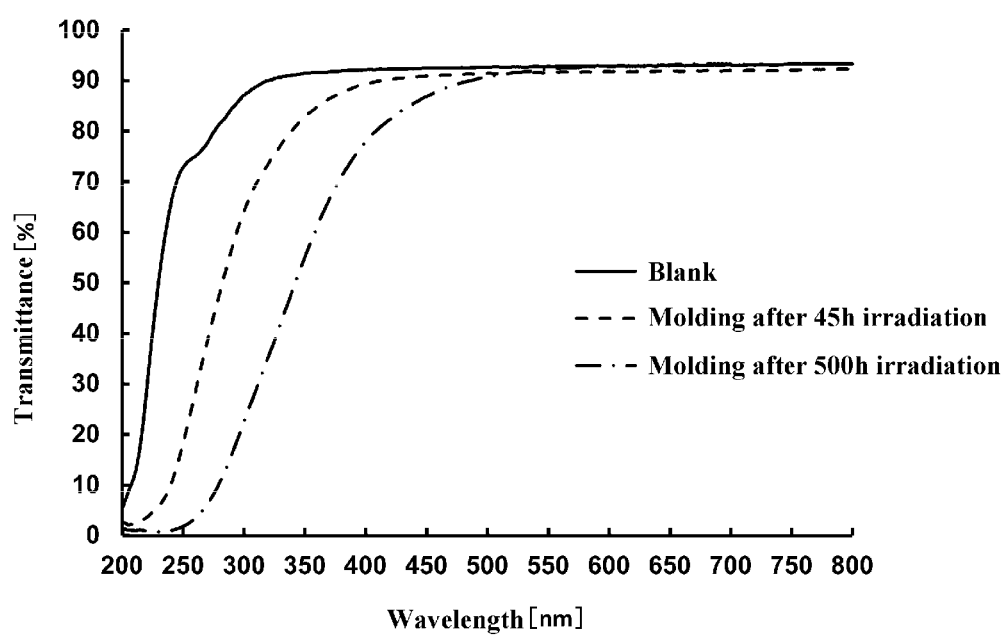
FIG. 11 is a diagram showing transmittances for every ultraviolet irradiation times which are the results of another transmission evaluation test on a modified molded optical member using the method for modifying optical properties of synthetic resin to which the present invention is applied and a modified molded optical member to which the present invention is not applied.

The results thereof are shown in FIG. 11.

As shown in FIG. 11, when ultraviolet rays were irradiated to the raw material before molding (before a condensation reaction) as in Comparative Example 1, the amount of impurity which had absorption in the ultraviolet range was increased, and thus the test sample was degraded to decrease the transmittances. Hence, it was confirmed that it was important to irradiate ultraviolet rays to the molded optical member (optical member subjected to the condensation reaction) to modify the optical member.

(Yellowing Evaluation Test)

For the test sample molded after ultraviolet irradiation for 45 hours and the test sample molded after ultraviolet irradiation for 500 hours obtained in Comparative Example 1 and the test sample subjected to ultraviolet irradiation for 45 hours after molding obtained in Example 8, the spectrophotometer was used to measure the degree of yellowing Y1. The results thereof are shown in Table 2 below.

TABLE 2

| Test sample | Ultraviolet irradiation | Degree of yellowing Y1 |
|---|---|---|
| Blank | Without (only molding) | 0.65 |
| Example 8 | With (after molding) | 0.66 |
| Comparative Example 1 | With (before molding) | 1.12 |
| Comparative Example 1 | With (before molding) | 6.28 |

As shown in Table 2, when ultraviolet rays were irradiated to the raw material before molding (before the condensation reaction) as in Comparative Example 1, as the irradiation time was extended, yellowing was recognized after molding, whereas when ultraviolet rays were irradiated after molding, almost no yellowing was recognized. Hence, it was confirmed that it was important to irradiate ultraviolet rays to the molded optical member (optical member subjected to the condensation reaction), that is, the cured product to modify the optical member.

Examples 9 to 10 and Comparative Examples 2 and 3: XPS Elemental Analysis

Test samples each having a different thickness were produced as in Example 1 except that the thickness and the irradiation time were set as in Table 3 below. XPS elemental analysis was performed on the test samples. The XPS elemental analysis was measured with an X-ray photoelectron spectrometer (device name: K-ALPHA, made by Thermo Fisher Scientific, Inc.). The results thereof are also shown in Table 3.

component was formed, a part of a condensation-type or addition-type silicone resin serving as an organic polymer resin was formed into an inorganic structure, the bond chain (Si—C bond chain) of the silicone polymer was reduced in amount and consequently, the transmittances in the ultraviolet range, especially at wavelengths of 200 to 300 nm or at wavelengths of 200 to 260 nm in particular was increased.

Examples 11 and 12 and Comparative Example 4: Test Sample Production and Transmission Evaluation Test 1

As a raw material, a fluorine resin (product number CTX-809SP2 made by AGC Inc.) which was an amorphous fluorine resin was used, the fluorine resin was heated to be cured and thus an untreated test sample having a thickness of 0.05 mm was obtained.

Under the same conditions as in transmission evaluation test 1, ultraviolet rays were irradiated, and transmittances were measured. The measurement of the transmittances were performed with the spectrophotometer UV-3600Plus and the integrating sphere unit (product number ISR-1503 made by Shimadzu Corporation) for Comparative Example 4: when ultraviolet rays were not irradiated (irradiation energy of 0 kJ/cm$^2$), Example 11: after ultraviolet irradiation for 21 hours (irradiation energy of 5.29 kJ/cm$^2$), and Example 12: after 1005 hours thereof (irradiation energy of 253.26 kJ/cm$^2$). As the results thereof, transmittances at wavelengths of 200 to 800 nm are shown in FIG. 12(a), and transmittances at wavelengths of 200 to 300 nm are enlarged and shown in FIG. 12(b).

Hence, although the details of a mechanism are not necessarily found, it is estimated that the photo-oxidation treatment and/or the thermal oxidation treatment was performed on the amorphous fluorine resin, and thus the modification treatment was performed to metamorphose, decompose, volatilize, reduce and/or remove the component of the fluorine resin or at least a part of the fluorine resin was structurally changed or chemically changed and consequently, the transmittances in the ultraviolet range, espe-

TABLE 3

| | | Comparative Example 2 | Example 9 | Comparative Example 3 | Example 10 |
|---|---|---|---|---|---|
| Production conditions | Thickness | 0.4 mm | 0.4 mm | 0.7 mm | 0.7 mm |
| | Ultraviolet irradiation treatment | Without irradiation | Irradiation for 130 hours | Without irradiation | Irradiation for 130 hours |
| XPS elemental analysis | Si % | 26.64 | 23.19 | 23.25 | 25.88 |
| | O % | 43.28 | 48.04 | 41.63 | 44.80 |
| | C % | 30.08 | 28.77 | 35.12 | 29.32 |

As shown in Table 3, it was confirmed that the ratio of O element was increased and the ratio of C element was reduced by an oxidation reaction.

Hence, although the details of a mechanism are not necessarily found, it is estimated that the photo-oxidation treatment and/or the thermal oxidation treatment was performed on a condensation-type silicone resin to which ultraviolet rays were not irradiated or on which heating was not performed, and thus since the Q structure and/or the glass structure were formed like a phenomenon in which the bond chain (Si—C bond chain) of a silicone polymer was cleaved, an oxygen atom and a silicon atom were recombined and a hard surface containing silicon dioxide as a main cially at wavelengths of 200 to 300 nm or at wavelengths of 200 to 260 nm in particular were increased.

(Transmission Evaluation Test 4)

Figure 13:
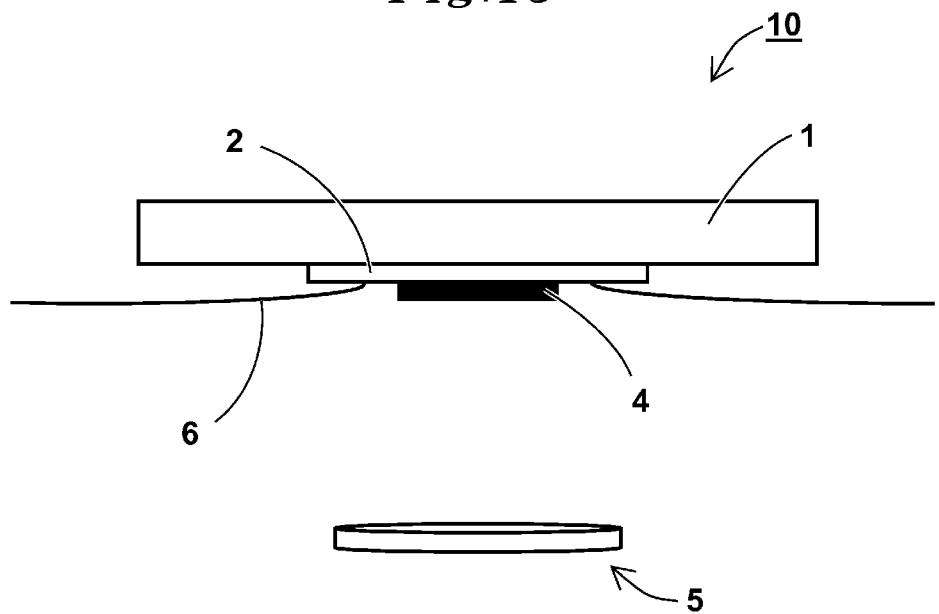
FIG. 13 is a diagram showing an outline of a test device for performing a transmission evaluation test on a modified molded optical member using the method for modifying optical properties of synthetic resin to which the present invention is applied.

As a transmission evaluation test environment, as shown in FIG. 13, an aluminum plate 2 was placed on a cooling chiller 1 for reducing influence caused by heat generation and a deep ultraviolet UV-C LED (product number NCSU334A made by Nichia Corporation) serving as an ultraviolet LED 4 was placed on the aluminum plate 2, the ultraviolet LED 4 was connected to a power supply with a wiring code 6 and a test sample 5 was installed immediately below the ultraviolet LED 4, with the result that a test device 10 was prepared. A distance between the ultraviolet LED 4 and the test sample 5 was set to 30 mm. In an atmospheric environment of 25° C., ultraviolet rays having an irradiation energy of 0.04 to 0.21 kJ/cm² were irradiated to the test device, and a transmission evaluation test for measuring variations in transmittance was performed on the test sample on which the irradiation treatment was performed.

The test conditions of the transmission evaluation test were as follows.

Rated current value: 350 mA
Rated forward voltage: 5.2 V
Peak wavelength: 280 nm
Irradiation intensity to test sample: maximum intensity of 0.5 to 0.7 mW/cm²
Irradiation intensity measuring devices: UIT-250 and UVD-S254 (made by USHIO INC.)

The measurement of the transmittance was performed on the test sample in Example 1A with the spectrophotometer UV-3600Plus and the integrating sphere unit (product number ISR-1503 made by Shimadzu Corporation) after ultraviolet irradiation for 24 hours (irradiation energy of 0.04 kJ/cm²), after ultraviolet irradiation 96 hours (irradiation energy of 0.17 kJ/cm²) and after ultraviolet irradiation for 120 hours (irradiation energy of 0.21 kJ/cm²).

Example 13: Test Sample Production and Optical Property Modification Test

As a raw material in Example 13, a silicone resin (product number YR3370 made by Momentive Performance Materials Inc.) which was white solid (flake) and in which all organic substituents were methyl groups, was used.

A method for molding a test sample was as follows.

16 g of the raw material (YR3370) was weighed, was put into a mold for forming a circular flat plate-shape and was heated to be cured, and thus an untreated test sample having a thickness of 4 to 5 mm in Example 13 was obtained.

Thereafter, on the untreated test sample, thermal oxidation treatment using heating within an oven of 200° C. for 3 hours was performed, and then under the conditions of transmission evaluation test 4, ultraviolet rays were irradiated, and transmittances were measured. Transmittances in Example 13 without ultraviolet irradiation (0 kJ/cm², 0 hour: blank) were also measured.

As the results thereof, transmittances at wavelengths of 200 to 800 nm are shown in FIG. 14(*a*), and transmittances at wavelengths of 200 to 300 nm are enlarged and shown in FIG. 14(*b*).

It was confirmed that even under the conditions of transmission evaluation test 4, transmittances at wavelengths of 200 to 300 nm in the ultraviolet range or at wavelengths of 200 to 280 nm in particular were sufficiently increased by 5% or more.

INDUSTRIAL APPLICABILITY

A method for modifying optical properties of a synthetic resin according to the present invention is useful for manufacturing optical members in the fields of disinfection, sterilization and water and air purification in which high transmittances are needed in an ultraviolet wavelength range and in a deep ultraviolet range in particular and/or optical members in optical fields in which wavelengths in the ultraviolet wavelength range and in the deep ultraviolet range in particular are concentrated, diffused or guided.

EXPLANATIONS OF LETTERS OR NUMERALS

1: cooling chiller, 2: aluminum plate, 3: spacer, 4: ultraviolet LED, 5: test sample, 6: wiring code, 8: test device, 10: test device, 14: ultraviolet light source, 17(*a*): dark room, 17(*b*): blackout curtain, 18: irradiation facility

What is claimed is:

1. A method for modifying an optical property of a synthetic resin so as to transmit any of ultraviolet rays, comprising:
    a modification treatment, which is a photo-oxidation treatment of or photo-oxidation and thermal oxidation treatments of an energy irradiation treatment of 5.2 kJ/cm² with rays of light having a wavelength of 360 nm or less and is performed on a cured product made of a synthetic resin which is at least one selected from the group consisting of a condensation polymerized silicone resin, an addition polymerized silicone resin, and a radical polymerized silicone resin to increase 18% or more of a transmittance in 246-280 nm of an ultraviolet range,
    wherein in the modification treatment, the photo-oxidation treatment is a treatment which irradiates the cured product with rays of light having a wavelength of 200-360 nm, and the thermal oxidation treatment is a treatment which heats the cured product at 150 to 250° C.,
    wherein the synthetic resin is a T unit-containing three-dimensional cross-linked silicone resin which has a T unit repeat structure and is selected from the group consisting of a T resin including the T unit, an MTQ resin including a combination of an M unit, a T unit and a Q unit, an MDTQ resin including a combination of an M unit, a D unit, a T unit and a Q unit, a DT resin including a combination of a D unit and a T unit and a TDQ resin including a combination of a D unit, a T unit and a Q unit,
    wherein the M unit is a monoorganosiloxy unit, the D unit is a diorganosiloxy unit, the T unit is a triorganosiloxy unit and the Q unit is a siloxy unit,
    wherein the synthetic resin has a T unit or a Q unit which is 60% or more, or wherein the synthetic resin has the DT structure as a main structure of which the ratio of the T unit to the D unit is 70 to 99% or the synthetic resin has only a T unit,
    and wherein the ratio of C element in the cured product on which the photo-oxidation treatment and/or the thermal oxidation treatment is performed is reduced, and the ratio of O element therein is increased by 1%, both which are compared with the cured product on which the photo-oxidation treatment and/or the thermal oxidation treatment is not performed.

2. The method for modifying optical properties of synthetic resin according to claim 1,
    wherein the modification treatment is performed to provide an optical property for modification in which the transmittance on at least one of wavelengths of 200 to 280 nm in the deep ultraviolet range is at least 70%.

3. The method for modifying optical properties of synthetic resin according to claim 1,
    wherein the synthetic resin includes, among the M unit, the D unit, the T unit and the Q unit, at least one of the T unit and the D unit so as to provide the optical property.

4. The method for modifying optical properties of synthetic resin according to claim 3,
    wherein
    at least a part of one of the M unit, the D unit and the T unit is changed by the modification treatment so as to provide the optical property.

5. The method for modifying optical properties of synthetic resin according to claim 3,
   wherein a Q structure and/or a glass structure is formed by the at least a part of one of the M unit, the D unit and the T unit so as to provide the optical property.

6. The method for modifying optical properties of synthetic resin according to claim 1,
   wherein a raw material composition of the cured product is subjected to forming, molding, applying, coating, and/or spraying so as to provide the cured product.

7. The method for modifying optical properties of synthetic resin according to claim 1,
   wherein a transmittance on at least one of wavelengths of 200 to 250 nm is at least 80%.

8. The method for modifying optical properties of synthetic resin according to claim 1,
   wherein a transmittance for a thickness of 1 mm on each of wavelengths of 250 to 300 nm is at least 90%.

9. The method for modifying optical properties of synthetic resin according to claim 1,
   wherein the modification treatment is a photo-oxidation treatment.

10. The method for modifying optical properties of synthetic resin according to claim 1,
    wherein the modification treatment is a photo-oxidation treatment and a thermal oxidation treatment.

* * * * *